(12) United States Patent
Iguchi et al.

(10) Patent No.: US 9,564,334 B2
(45) Date of Patent: Feb. 7, 2017

(54) METHOD OF MANUFACTURING A SEMICONDUCTOR DEVICE

(71) Applicant: FUJI ELECTRIC CO., LTD., Kawasaki-shi, Kanagawa (JP)

(72) Inventors: Kenichi Iguchi, Kawasaki (JP); Haruo Nakazawa, Kawasaki (JP); Tsunehiro Nakajima, Kawasaki (JP); Masaaki Ogino, Kawasaki (JP); Masaaki Tachioka, Kawasaki (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/065,853

(22) Filed: Mar. 9, 2016

(65) Prior Publication Data

US 2016/0189969 A1 Jun. 30, 2016

Related U.S. Application Data

(63) Continuation of application No. PCT/JP2014/061087, filed on Apr. 18, 2014.

(51) Int. Cl.
*H01L 21/285* (2006.01)
*H01L 29/16* (2006.01)
(Continued)

(52) U.S. Cl.
CPC ....... *H01L 21/28518* (2013.01); *H01L 21/049* (2013.01); *H01L 21/0485* (2013.01);
(Continued)

(58) Field of Classification Search
CPC .................................................. H01L 21/02252
See application file for complete search history.

(56) References Cited

U.S. PATENT DOCUMENTS

| 2008/0124922 A1 | 5/2008 | Kawamura et al. |
| 2010/0155808 A1 | 6/2010 | Makihara et al. |

(Continued)

FOREIGN PATENT DOCUMENTS

| JP | 2008-135635 A | 6/2008 |
| JP | 2009-177102 A | 8/2009 |

(Continued)

OTHER PUBLICATIONS

Katsunori Makihara et al., "Fabrication of Multiply-Stacked Structures of Si Quantum-Dots Embedded in SiO2 by Combination of Low-pressure CVD and Remote Plasma Treatments", 2004 International Microprocesses and Nanotechnology Conference, Digest of Papers, IEEE, pp. 216-217, Oct. 27-29, 2004.

(Continued)

*Primary Examiner* — Daniel Whalen
*Assistant Examiner* — Suberr Chi
(74) *Attorney, Agent, or Firm* — Rabin & Berdo, P.C.

(57) ABSTRACT

A method of manufacturing a semiconductor device includes forming a device structure in a surface of a semiconductor substrate, forming, in a face of the semiconductor substrate, a transition metal layer that contacts the semiconductor substrate, and exposing the semiconductor substrate having the transition metal layer formed thereon to a hydrogen plasma atmosphere formed by microwaves to cause the transition metal layer to generate heat. During exposure of the semiconductor substrate to the hydrogen plasma atmosphere, a portion of the semiconductor substrate contacting the transition metal layer is heated by a transfer of the heat from the transition metal layer, and an ohmic contact is formed at an interface of the transition metal layer and the semiconductor substrate by reaction of the transition metal layer and the semiconductor substrate. When the semicon- (Continued)

ductor substrate is silicon carbide, the ohmic contact is composed of a silicide, such as a transition metal silicide.

9 Claims, 8 Drawing Sheets

(51) Int. Cl.
*H01L 21/04* (2006.01)
*H01L 29/45* (2006.01)
*H01L 29/66* (2006.01)

(52) U.S. Cl.
CPC .... *H01L 21/28568* (2013.01); *H01L 29/1608* (2013.01); *H01L 29/45* (2013.01); *H01L 29/66068* (2013.01)

(56) References Cited

U.S. PATENT DOCUMENTS

| | | |
|---|---|---|
| 2012/0171863 A1 | 7/2012 | Suzuki et al. |
| 2012/0326167 A1 | 12/2012 | Tamaso |
| 2014/0004690 A1 | 1/2014 | Isogai et al. |
| 2015/0056381 A1 | 2/2015 | Hori et al. |

FOREIGN PATENT DOCUMENTS

| | | |
|---|---|---|
| JP | 2011-066060 A | 3/2011 |
| JP | 2012-099599 A | 5/2012 |
| JP | 2012-186189 A | 9/2012 |
| JP | 2013-178917 A | 9/2013 |
| WO | WO 2009-118783 A1 | 10/2009 |

OTHER PUBLICATIONS

Kiyokazu Nakagawa, "New Heating Method for Polycrystallization of Amorphous Si Using Microwave Plasma Irradiation", ECS Transactions 16(10), The Electrochemical Society, pp. 905-908, Aug. 29, 2008.

Hiroki Nakaie et al., "Formation of Polycrystalline Si Films for Thin-film Transistors by Selective Heating Method of Transition Metal with Hydrogen Radical Irradiation", The 74th Japan Society of Applied Physics Autumn Meeting, 17p-P2-47, 2013.

H. Nakamura et al., "Development of Heating Method of Transition Metal using Hydrogen Plasma (II)", The 59th Japan Society of Applied Physics and Related Societies Spring Meeting, 16a-A6-9, 2012.

Miyazaki S. et al., "Fabrication of Metal Silicide Nanodots and Hybrid Stacked Structure in Combination with Silicon Quantum Dots for Floating Gate Application", Proceddings of the 3rd Asian Physics Symposium, pp. 13-17, 2009.

Katsunori Makihara et al., "Self-Assembling Formation of Ni Nanodots on SiO2 Induced by Remote H2 Plasma Treatment and Their Electrical Charginh Characteristics", Japanese Journal of Applied Physics, vol. 47, No. 4, pp. 3099-3102, 2008.

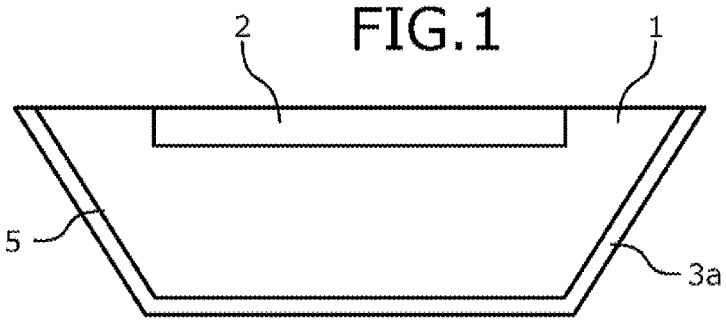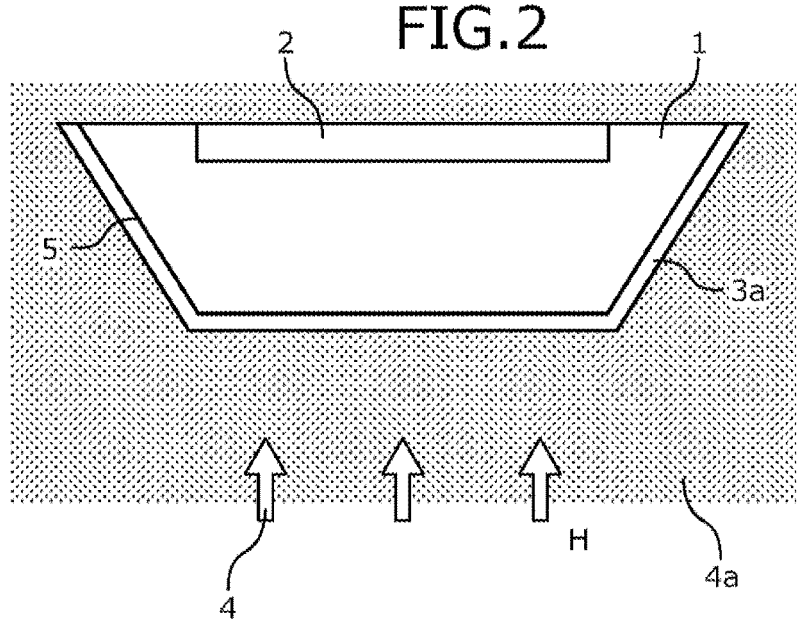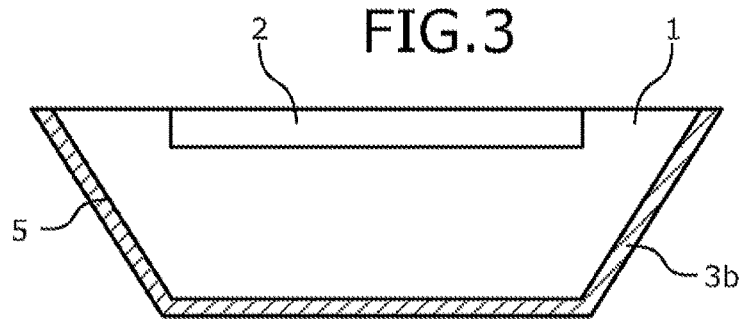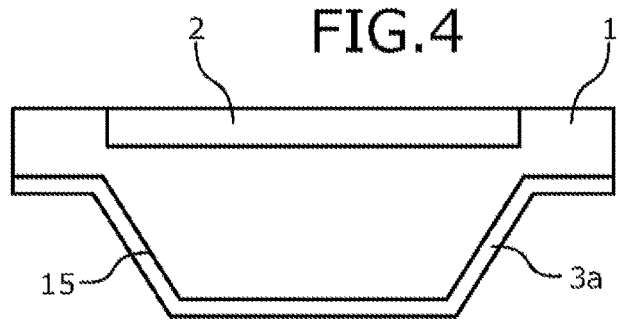

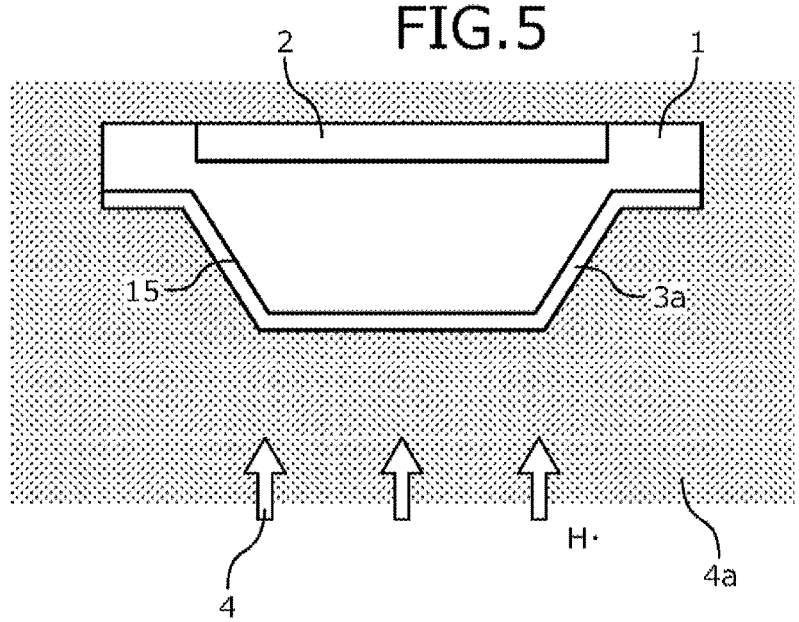
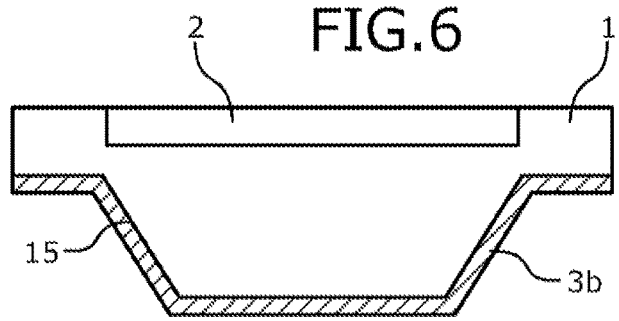
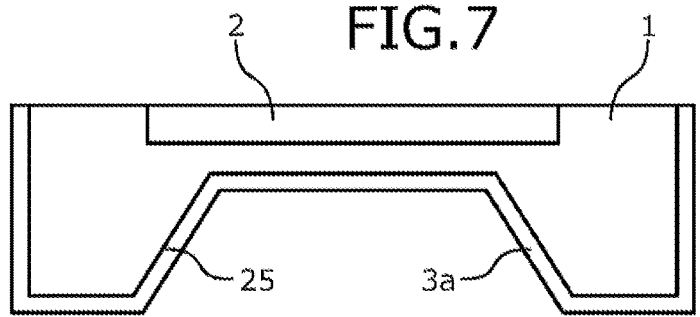

METHOD OF MANUFACTURING A SEMICONDUCTOR DEVICE

CROSS REFERENCE TO RELATED APPLICATIONS

This non-provisional application is a continuation of International Application PCT/JP2014/061087 filed on Apr. 18, 2014, and designating the U.S., the entire contents of which are incorporated herein by reference.

BACKGROUND OF THE INVENTION

1. Field of the Invention

The embodiments discussed herein are related to a method of manufacturing a semiconductor device.

2. Description of the Related Art

Conventionally, in a semiconductor device (silicon carbide semiconductor apparatus) using a silicon carbide (SiC) semiconductor, an ohmic contact (electrical contact portion) of a silicon carbide semiconductor portion and a transition metal layer (electrode) is formed by heat treatment (annealing). A high temperature of about 1000 degrees C. or more is used to form the ohmic contact. Heat treatment methods include, for instance, furnace annealing, laser annealing, and lamp annealing. Heat treatment of a vertical device having an electrode on both surfaces of a semiconductor substrate will be described with reference to FIGS. 12 to 15 as an example.

In a vertical device, a contact for the respective electrodes has to be formed in both surfaces of the semiconductor substrate. Therefore, as depicted in FIGS. 12 to 15, after a device structure 102 of the semiconductor front surface side is formed, heat treatment is performed after a back surface contact electrode 103 of the substrate back surface side has been formed. FIG. 12 is a cross-sectional view schematically depicting the state of a conventional vertical device during furnace annealing. With furnace annealing 104, although the entire back surface contact electrode 103 can be heated evenly, a semiconductor substrate (semiconductor wafer) 101 is also entirely heated uniformly. As a result, a problem arises in that device properties and fabrication materials degrade, putting constraints on the sequence of manufacturing processes. A hatched region indicated by reference numeral 103b represents the back surface contact electrode (silicide layer) after annealing (similarly for FIGS. 13 to 15).

FIGS. 13, 14, and 15 are cross-sectional views schematically depicting the state of a conventional vertical device during laser annealing. In the laser annealing, as depicted in FIG. 13, after the device structure 102 of the front surface side is formed, for example, the thickness of the semiconductor wafer is thinned to reduce conduction loss and in a back surface of the thinned semiconductor wafer 101, the back surface contact electrode 103 is formed. While laser 105 having a reduced spot diameter sweeps (indicated by arrows), predetermined regions of the back surface contact electrode 103a before annealing are sequentially irradiated to form a silicide. As a result, the back surface contact electrode 103 alone can be uniformly heated, even in cases where the thickness of the semiconductor wafer 101 is thinner at some portions, device surfaces are uneven, or slopes are present, as depicted in FIGS. 14 and 15, for example.

FIG. 14, for example, depicts a state where, by a trench 106 that penetrates a semiconductor wafer 101 in a direction of depth and is formed along a dicing line (not depicted) between regions that become a semiconductor chip 111, a side surface of a region that becomes the semiconductor chip 111 is slanted at a predetermined angle with respect to the wafer surface to form a tapered shape. FIG. 15 depicts a state where the strength of a thinned semiconductor wafer 101 is enhanced by, for example, reducing the thickness of only a predetermined region 101a by a trench 106 of a predetermined depth and leaving other portions 101b to have a significant thickness to prevent cracking caused by handling during wafer delivery, internal stress of the semiconductor wafer 101, etc.

To form an ohmic contact in a semiconductor substrate formed of silicon carbide (hereinafter, silicon carbide substrate), a method of vapor depositing a transition metal layer in a contact on the silicon carbide substrate and heating the entire silicon carbide substrate by rapid heat treatment at 1000 degrees C. for 2 minutes to form a silicide contact electrode with a high carbon content has been proposed (for example, refer to Japanese Laid-Open Patent Publication No. 2009-177102 (paragraph 0017)).

Another method has been proposed where after a nickel (Ni) layer is formed on a silicon wafer, hydrogen ($H_2$) gas is introduced into the chamber creating a hydrogen gas atmosphere in the chamber, and a susceptor is heated to 450 to 550 degrees C. by a heater to heat treat the silicon wafer (for example, refer to Japanese Laid-Open Patent Publication No. 2011-066060 (paragraphs 0037 to 0040)). In Japanese Laid-Open Patent Publication No. 2011-066060, impurities in the nickel film are removed by hydrogen atoms entering the nickel layer, facilitating the reaction between silicon atoms in the wafer and nickel atoms in the nickel layer.

A further method has been proposed where after a titanium (Ti) layer, an aluminum (Al) layer, and a silicon layer are sequentially formed on a silicon carbide substrate by sputtering to form a contact electrode, annealing via laser is performed whereby the titanium, aluminum, and silicon included in the contact electrode and the silicon and carbon included in the silicon carbide substrate form an alloy (for example, refer to Japanese Laid-Open Patent Publication No. 2012-099599 (paragraphs 0042 to 0044)).

Yet another method has been proposed where an oxide film ($SiO_2$), quantum dots formed from silicon, and a nickel (Ni) thin film are sequentially stacked on a silicon substrate and subject to remote hydrogen plasma processing for 5 minutes at a frequency of 60 MHz and a very high frequency (VHF) electrical power of 200 W to 500 W to form nickel silicide dots from a stacked film formed from the quantum dots and nickel thin film (for example, refer to Republished Japanese-Translation of PCT Application, Publication No. 2009-118783 (paragraphs 0056 to 0061)).

Nonetheless, with Japanese Laid-Open Patent Publication Nos. 2009-177102 and 2011-066060, portions forming the ohmic contact (i.e., the transition metal layer, or the interface of the substrate and the transition metal layer) cannot be heated selectively, the entire substrate (the entire device) is uniformly heated. Therefore, as described above, interface properties of the semiconductor portion and gate insulating film, and fabrication materials of the device may degrade. Further, constituent portions formed of a material having a lower upper temperature limit than the heat treating temperature cannot be formed before the heat treatment for forming the ohmic contact. For example, constituent portions formed of resin or having a low melting point metal such as aluminum have to be formed after the heat treatment for forming the ohmic contact.

In Japanese Laid-Open Patent Publication No. 2012-099599, by reducing the spot diameter of the laser 105, a predetermined region can be selectively heated (refer to FIGS. 13 to 15) and therefore, the problems associated with Japanese Laid-Open Patent Publication Nos. 2009-177102 and 2011-066060 can be resolved. Nonetheless, the efficiency of heating decreases if the distance from the converging lens (not depicted) that converges the light of the laser 105, to the irradiation position of the laser 105 deviates. Therefore, as depicted in FIGS. 14 and 15, in cases where the laser 105 is irradiated on a trench side wall that is slanted with respect to the wafer surface to form a tapered shape, or is irradiated on a steep chip side wall substantially orthogonal to the wafer surface, the distance from the converging lens to the irradiation position is not constant across the entire surface of the back surface contact electrode 103a consequent to the unevenness of the device surface. As a result, throughput may decrease since irradiation of the laser 105 has to be performed according to conditions corresponding to each irradiation position.

Further, in Japanese Laid-Open Patent Publication No. 2012-099599, irradiation voids occur consequent to deviation of the laser irradiation position, whereby contact resistivity becomes inconsistent; and near the transition metal layer, constituent portions (e.g., gate insulating film, etc.) other than the transition metal layer are heated, whereby device properties may degrade. Furthermore, if the surface area of the transition metal layer is smaller than the area corresponding to the spot diameter of the laser, a problem arises in that the transition metal layer alone cannot be selectively heated.

Moreover, for example, when a trench is formed that penetrates the semiconductor wafer in a direction of depth, a stage on which the semiconductor wafer is mounted, a support substrate supporting the semiconductor wafer and adhesive, etc. are exposed at the trench bottom. In this state, if furnace annealing or laser annealing is performed as in Japanese Laid-Open Patent Publication Nos. 2009-177102, 2011-066060, and 2012-099599, members exposed at the trench bottom degrade, outgassing, particulate formation, etc. occur, and defects such as hardening may occur.

In Republished Japanese-Translation of PCT Application, Publication No. 2009-118783, since the transition metal layer alone generates heat by remote hydrogen plasma processing irrespective of device surface unevenness, transition metal layer patterns, etc., the transition metal layer alone can be uniformly heated. Nonetheless, in Republished Japanese-Translation of PCT Application, Publication No. 2009-118783, high-density plasma is not created because the pressure is lowered to increase the lifetime of the hydrogen atoms. Therefore, a problem arises in that the hydrogen atom density becomes low, whereby rapid heating is not possible. In practice, since plasma processing at a low electrical power of 200 W to 500 W is performed for a long period, during the plasma processing, constituent portions other than the transition metal layer (e.g., the entire device) are heated by a transfer of the heat generated by the transition metal layer and as a result, device properties may degrade.

SUMMARY OF THE INVENTION

According to one aspect of the present inventiona method of manufacturing a semiconductor device includes forming a device structure in a surface of a semiconductor substrate; forming in a face of the semiconductor substrate, a transition metal layer that contacts the semiconductor substrate; and exposing the semiconductor substrate having the transition metal layer formed thereon to a hydrogen plasma atmosphere formed by microwaves to cause the transition metal layer to generate heat. In exposing the semiconductor substrate to the hydrogen plasma atmosphere, by a transfer of the heat from the transition metal layer, a portion of the semiconductor substrate contacting the transition metal layer is heated, and at an interface of the transition metal layer and the semiconductor substrate, an ohmic contact is formed by a reaction of the transition metal layer and the semiconductor substrate.

In the method, in forming the transition metal layer, the face of the semiconductor substrate where the transition metal layer is formed is a same face as a face where the device structure is formed and the method further includes after forming the device structure and before forming the transition metal layer, forming a metal layer so as to cover the device structure. In forming the metal layer, in a surface of the metal layer, a strongly bonded oxide film is formed that consumes more time to be reduced during exposure of the semiconductor substrate to the hydrogen plasma atmosphere than an oxide film of a surface of the transition metal layer. In forming the transition metal layer, the transition metal layer that contacts the semiconductor substrate is formed at a portion of the semiconductor substrate excluding a portion where the device structure is disposed. In exposing the semiconductor substrate to the hydrogen plasma atmosphere, the semiconductor substrate having the metal layer and the transition metal layer formed thereon is exposed to the hydrogen plasma atmosphere to reduce the strongly bonded oxide film of the surface of the metal layer and cause the transition metal layer to generate the heat, and before or when reduction of the strongly bonded oxide film of the surface of the metal layer is completed, exposing the semiconductor substrate to the hydrogen plasma atmosphere is completed.

In the method, after forming the device structure and before forming the metal layer, a barrier layer comprising a metal and preventing a transfer of the heat from the transition metal layer is formed so as to cover the device structure. In forming the metal layer, the metal layer is formed on the barrier layer.

In the method, the metal layer comprises titanium.

In the method, the transition metal layer is a metal layer comprising nickel, titanium, or tungsten, or an alloy layer comprising at least one of nickel, titanium, tungsten, molybdenum, tantalum, and silver as a primary component.

In the method, the device structure is an insulating gate structure comprising a metal-oxide film semiconductor.

In the method, in forming the transition metal layer, the face of the semiconductor substrate where the transition metal layer is formed is on an opposite side of the semiconductor substrate with respect to the face where the device structure is formed. The method includes after forming the device structure and before forming the transition metal layer, forming a predetermined pattern in the face that is on the opposite side of the semiconductor substrate with respect to the face where the device structure is formed.

In the method, the predetermined pattern has an uneven step, and an angle formed by a side wall of the step and the face that is on the opposite side of the semiconductor substrate with respect to the face where the device structure is formed is at least 45 degrees and at most 75 degrees.

BRIEF DESCRIPTION OF THE DRAWINGS

FIG. 1 is a cross-sectional view of a semiconductor device during manufacture according to a first embodiment;

FIG. 2 is a cross-sectional view of the semiconductor device during manufacture according to the first embodiment;

FIG. 3 is a cross-sectional view of the semiconductor device during manufacture according to the first embodiment;

FIG. 4 is a cross-sectional view of a semiconductor device during manufacture according to a second embodiment;

FIG. 5 is a cross-sectional view of the semiconductor device during manufacture according to the second embodiment;

FIG. 6 is a cross-sectional view of the semiconductor device during manufacture according to the second embodiment;

FIG. 7 is a cross-sectional view of a semiconductor device during manufacture according to s third embodiment;

DETAILED DESCRIPTION OF THE INVENTION

Figure 8:
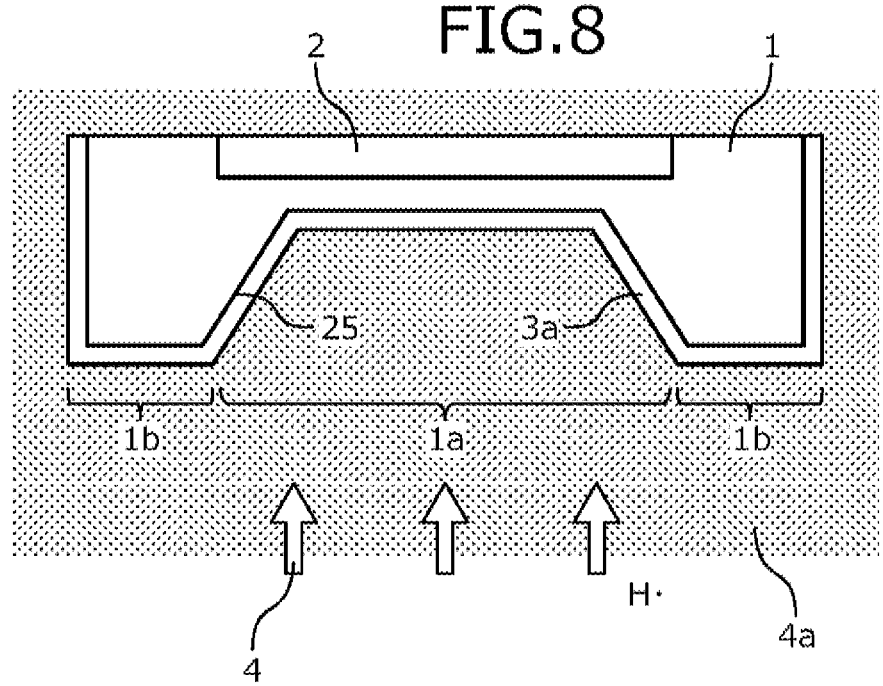
FIG. 8 is a cross-sectional view of the semiconductor device during manufacture according to the third embodiment.

Preferred embodiments of a method of manufacturing a semiconductor device according to the present invention will be described with reference to the accompanying drawings. In the description of the embodiments below and the accompanying drawings, identical constituent elements will be given the same reference numerals and will not repeatedly be described. In the present description and accompanying drawings, layers and regions prefixed with n or p mean that majority carriers are electrons or holes. When Miller indices are described, "−" means a bar added to an index immediately after the "−", and a negative index is expressed by prefixing "−" to the index.

First Embodiment

The method of manufacturing a semiconductor device according to a first embodiment will be described taking an example where a semiconductor device is produced (manufactured) using a semiconductor substrate formed from silicon carbide (silicon carbide substrate). FIGS. 1, 2, and 3 are cross-sectional views of a semiconductor device during manufacture according to the first embodiment. As depicted in FIG. 1, in a front surface side of a silicon carbide substrate (silicon carbide wafer), a device structure 2 is formed in a region that, for example, becomes a semiconductor chip 1. Next, for example, from a back surface side, the silicon carbide wafer is ground to a position marking a product thickness for use as a semiconductor device and thus, the thickness of the silicon carbide wafer is reduced.

Next, a trench 5 that penetrates the semiconductor wafer in a direction of depth from the back surface of the semiconductor wafer is formed along a dicing line (not depicted) between regions becoming the semiconductor chip 1. Here, a side surface (i.e., a side wall of the trench 5) of a region that becomes the semiconductor chip 1 is slanted at a predetermined angle with respect to the wafer surface to form a tapered shape. Here, the angle of incline of the side surface of the region that becomes the semiconductor chip 1 is favorably 45 degrees or more and 75 degrees or less with respect to the back surface of the region that becomes the semiconductor chip 1. The reason for this is that when the angle of incline is less than 45 degrees, the area of the slanted portion becomes too large and when the angle of incline exceeds 75 degrees, the film thickness (thickness) of the metal layer of the side wall of the trench 5 becomes too thin. Next, a process of forming, for example, a region of a predetermined conductivity type in a portion (the side surface and back surface of the region that becomes the semiconductor chip 1) exposed at the back surface of the semiconductor wafer is performed. Next, for example, a back surface electrode 3a formed from a transition metal by a sputtering method, a vapor deposition method, etc. is formed in the entire portion that is exposed at the back surface of the semiconductor wafer.

A reverse blocking metal oxide semiconductor field effect transistor (RB-MOSFET) is an example of a semiconductor device having such a device structure. In this case, although not depicted, a MOS gate (insulating gate formed of a metal-oxide film-semiconductor) structure is formed as the device structure 2 of a chip front surface side; and in the back surface and the side surface becoming the semiconductor chip 1, a semiconductor region of a conductivity type that differs from that of the semiconductor chip 1 is formed to become a drift region.

The transition metal configuring the back surface electrode 3a is an element (metal) present within a range from the third element group to the eleventh element group in the periodic table of the elements. Preferably, the transition metal configuring the back surface electrode 3a is a metal formed from nickel (Ni), titanium (Ti), tungsten (W), molybdenum (Mo), tantalum (Ta), or silver (Ag); or alternatively is desirably an alloy containing one or more of these metals as a primary component, i.e., the component that is greatest in content by mole fraction. More preferably, the transition metal configuring the back surface electrode 3a is a metal formed from nickel, titanium, tantalum, or tungsten; or alternatively is desirably an alloy containing one or more of these metals as a primary component. The reason for this is that nickel, titanium, tantalum, and tungsten, compared to other transition metals, have a low material cost and easily form an ohmic contact with the semiconductor portion and consequently, are of high practical use. Further, the transition metal layer is of a thickness that can ensure heat is generated to an extent that the interface of the transition metal layer and the silicon carbide substrate (semiconductor chip 1) can be sufficiently heated; and preferably, the surface of transition metal layer is near (thin) the interface with the silicon carbide substrate to an extent enabling heat transfer to the surroundings resulting from thermal radiation to be prevented, without an occurrence of heat dissipation or insufficient energy required for forming the ohmic contact. More specifically, the thickness of the transition metal layer is preferably, for example, 10 nm or greater and 200 nm or less, and more preferably, 20 nm or greater and 100 nm or less.

Next, as depicted in FIG. 2, the entire silicon carbide wafer (the entire device including components formed on the wafer) is exposed to a hydrogen plasma atmosphere (hatched portion in drawing) 4a (plasma processing). As a result, a portion of the back surface electrode 3a exposed to the hydrogen plasma atmosphere 4a, or in a case where the thickness of the back surface electrode 3a is thin, the entire back surface electrode 3a, adsorbs hydrogen atoms or hydrogen radicals (H.) 4 (hereinafter, collectively, the hydrogen radicals 4) in the hydrogen plasma atmosphere 4a and is heated by the heat generated when hydrogen molecules are formed. Here, although the entire device surface is exposed to (irradiated with) the hydrogen radicals 4, the transition metal layer alone receives the bond energy from the hydrogen radicals 4 and generates heat. Therefore, constituent portions other than the back surface electrode 3a do not generate heat.

The heat generated by the back surface electrode 3a from the bond energy released when the hydrogen radicals 4 are adsorbed and hydrogen molecules formation is conducted toward a silicon carbide wafer side, i.e., a surface layer of the side surface and the back surface of the region that becomes the semiconductor chip 1. As a result, the entire surface of a portion in contact with the back surface electrode 3a of the silicon carbide wafer is heated and as depicted in FIG. 3, from the side surface to the back surface of the region that becomes the semiconductor chip 1, a silicide layer 3b is formed to become an ohmic contact (electrical contact portion) with the silicon carbide wafer. FIG. 3 depicts a case where the entire back surface electrode 3a becomes the silicide layer 3b (similarly for FIGS. 6 and 9). The increased temperature resulting from the heat generated by the back surface electrode 3a from the bond energy released when the hydrogen radicals 4 are adsorbed and hydrogen molecules formation is a temperature that enables the formation of the ohmic contact with the silicon carbide wafer and for example, is 800 degrees C. or greater, and preferably, 1000 degrees C. or greater.

The hydrogen plasma used in the plasma processing above, for example, is microwave plasma generated by reducing the pressure of substantially 100% pure hydrogen ($H_2$) gas in a chamber to a predetermined pressure, and using collisional ionization of the gas molecules and electrons accelerated by the electric field of the microwaves. The microwaves, for example, are of a frequency band that can be used in industry and are preferably a frequency of 1 GHz or greater to enable high-density hydrogen plasma to be generated, and more preferably, microwaves of a frequency of 2.45 GHz are used. Further, to generate high-density hydrogen plasma, for example, the pressure of the hydrogen gas is preferably lowered to about 10 Pa or more and 100 Pa or less. Hereinafter, the hydrogen plasma atmosphere formed by microwaves will be simply referred to as hydrogen plasma atmosphere.

As a condition of the plasma processing above the microwave electrical power is 1000 W or more when generating the hydrogen plasma atmosphere and the entire silicon carbide wafer is preferably exposed to the hydrogen plasma atmosphere for a short period (plasma processing period). The reason for this is that when the plasma processing period is long, the heat generated by the back surface electrode 3a during plasma processing is conducted throughout the entire silicon carbide wafer, heating the entire silicon carbide wafer. The temperature rise associated with the heat generated by the transition metal layer becomes highly dependent on the magnitude of the electrical power and the plasma density of the hydrogen plasma. Therefore, the electrical power and the plasma density of the hydrogen plasma suffices to be set such that the back surface electrode 3a receives the energy from the hydrogen radicals 4 and generates heat to a predetermined temperature within a short period of exposure to the hydrogen plasma atmosphere 4a.

Figure 16:
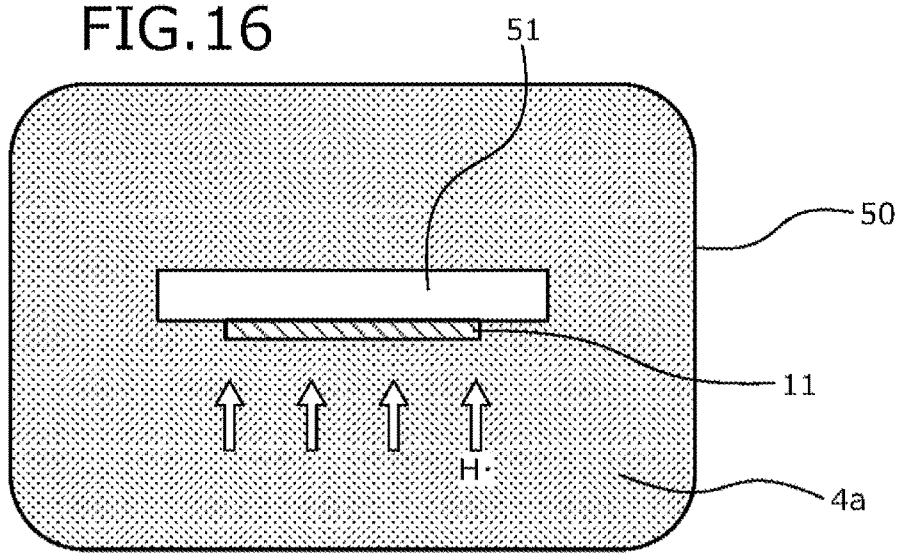
FIG. 16 is a cross-sectional view of the state of a silicon carbide wafer during the plasma processing in the method of manufacturing a semiconductor device according to the first embodiment.

The state of a silicon carbide wafer during the plasma processing above will be described. FIG. 16 is a cross-sectional view of the state of the silicon carbide wafer during the plasma processing in the method of manufacturing a semiconductor device according to the first embodiment. As depicted in FIG. 16, during the plasma processing above, a silicon carbide wafer 11 is supported in a plasma processing apparatus 50 by a stage 51. A support member such as the stage 51 is preferably constructed of a non-transition metal material that does not adsorb hydrogen radicals from the hydrogen plasma. The reason for this is that a surface of the silicon carbide wafer 11, i.e., the surface opposing the stage 51, can be prevented from being exposed to the hydrogen plasma atmosphere. Hereinafter, a structure of the stage 51 that supports the silicon carbide wafer 11 during plasma processing will be described.

Figure 17:
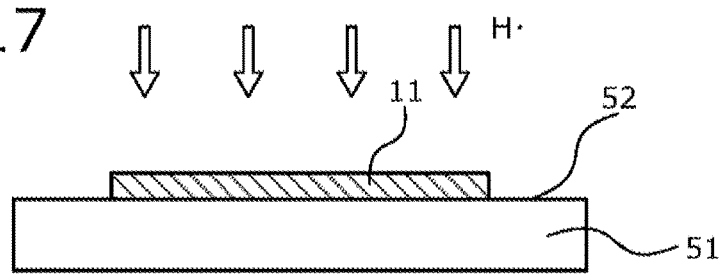
FIG. 17 is a cross-sectional view of an example of a stage that supports a silicon carbide wafer during the plasma processing in the method of manufacturing a semiconductor device according to the first embodiment.
Figure 18:
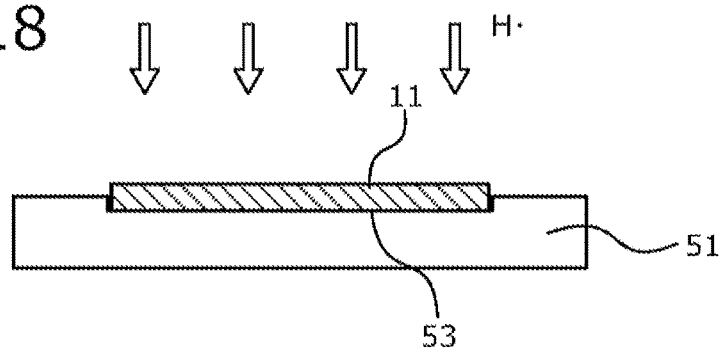
FIG. 18 is a cross-sectional view of an example of a stage that supports the silicon carbide wafer during the plasma processing in the method of manufacturing a semiconductor device according to the first embodiment.
Figure 19:
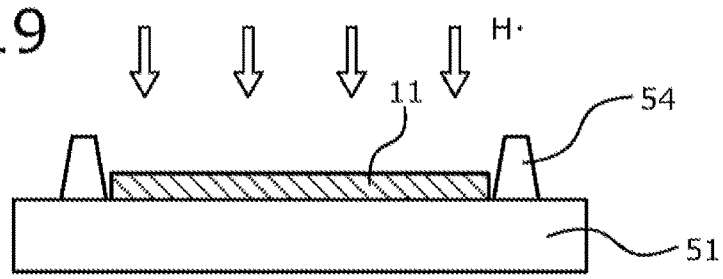
FIG. 19 is a cross-sectional view of an example of a stage that supports the silicon carbide wafer during the plasma processing in the method of manufacturing a semiconductor device according to the first embodiment.

FIGS. 17, 18, and 19 are cross-sectional views of examples of the stage that supports the silicon carbide wafer during the plasma processing in the method of manufacturing a semiconductor device according to the first embodiment. FIG. 17 depicts the stage 51 supporting the silicon carbide wafer 11 by a flat surface 52. The outer diameter of the stage 51 is preferably at least larger than the outer diameter of the silicon carbide wafer 11. The reason for this is that hydrogen radicals flow around a principal surface of the silicon carbide wafer 11, on the opposite side of the silicon carbide wafer 11 with respect to the principal surface subjected to plasma processing (hydrogen radicals flow around the principal surface that is in contact with the surface 52 of the stage 51, i.e., the principal surface on the side not irradiated with plasma), preventing an end of the principal surface on the side of the silicon carbide wafer 11 not irradiated with plasma from being heated.

FIG. 18 depicts the stage 51 having a concave-shaped groove (hereinafter, recess) in the surface supporting the silicon carbide wafer 11. The diameter of a recess 3 is greater than the outer diameter of the silicon carbide wafer 11. As a result, since the silicon carbide wafer 11 does not move in a direction parallel to the surface on which the silicon carbide wafer 11 is mounted on the stage 51, the recess 3 plays a role in positioning the entire silicon carbide wafer 11 inside a predetermined position on the stage 51 and has a function of preventing the entrance of hydrogen radicals into the silicon carbide wafer 11, through the surface on the side not subject to the plasma processing (the principal surface on the side in contact with the stage 51).

FIG. 19 depicts the stage 51 having a rib 54 that protrudes outward from the surface on the side supporting the silicon carbide wafer 11. The inner diameter of the rib 54 is greater than the outer diameter of the silicon carbide wafer 11. Since the silicon carbide wafer 11 does not move in a direction parallel to the surface on which the silicon carbide wafer 11 is mounted on the stage 51, the rib 54 plays a role in positioning the entire silicon carbide wafer 11 inside a predetermined position on the stage 51 and has a function of preventing hydrogen radicals from entering the surface of the silicon carbide wafer 11, on the side not subject to the plasma processing. The rib 54, for example, is disposed in a ring-shape surrounding the perimeter of the silicon carbide wafer 11 mounted on the stage 51. The arrangement (planar layout) of the rib 54 may be a continuous ring or is discontinuous ring.

As described, according to the first embodiment, the entire silicon carbide wafer (the entire device) in which the transition metal layer (back surface electrode) is formed in a surface is exposed to the hydrogen plasma atmosphere, whereby the transition metal layer adsorbs the hydrogen radicals in the hydrogen plasma atmosphere and is heated by the heat generated from the bond energy released when hydrogen molecules formation. Through a transfer of this heat generated by the transition metal layer, a portion of the silicon carbide wafer in contact with the transition metal layer is heated. As a result, the transition metal layer can be converted to silicide, enabling a silicide layer of low contact resistivity to be formed as an ohmic contact. Further, since the ohmic contact can be formed by the heat generated by the transition metal layer, irrespective of patterns and unevenness of the device surface, portions of the transition metal layer exposed to the silicon carbide wafer can be selectively and collectively heated, enabling throughput to be improved.

Further, according to the first embodiment, when the entire device is exposed to the hydrogen plasma atmosphere, constituent portions other than the transition metal layer do not generate heat. Therefore, for example, heat is not excessively applied near the gate insulating film of the MOS gate structure, thereby enabling degradation of device properties and the interface of the gate insulating film and the silicon carbide semiconductor portion to be prevented. Further, for example, even when consequent to a trench that penetrates the silicon carbide wafer in a direction of depth, the stage on which the semiconductor wafer is mounted, or the adhesive and the support substrate supporting the semiconductor wafer are exposed at the trench bottom, these members are not heated. As a result, defects resulting from the support substrate and adhesive being heated do not occur.

According to the first embodiment, since the transition metal layer alone can be caused to generate heat and be heated with favorable control, contact resistivity deviations, unintended heating of constituent portions (e.g., gate insulating film, etc.), and degradation of device properties can be suppressed without needing complicated programing such as for laser annealing. Further, the minimum area that can be heated is a limiting factor for patterning techniques of transition metal layers by photolithography, however, according to the first embodiment, a region of a smaller surface area than the area corresponding to the spot diameter of the laser can be heated.

With conventional heat treatment, carbon deposits and agglomerates on the surface of the nickel silicide layer and at portions where carbon deposits and agglomerates, a problem arises in that, for example, the electrode peels. However, in the present invention, the amount of carbon deposited on the surface of the nickel silicide layer can be reduced and it has been confirmed by the inventors that problems occurring with the conventional techniques do not occur. The problems do not occur presumably for the following two reasons. The first reason is that compared to heating by a conventional heat treatment method, in the present invention, it is possible to heat the silicon carbide semiconductor portion directly beneath the transition metal layer by rapid heating for a short processing period using the bond energy released when hydrogen radicals adsorbed by the transition metal layer forming hydrogen molecules. Therefore, before carbon deposits on the surface of the nickel silicide layer (ohmic contact) or before a large amount of carbon deposits, the nickel silicide layer can be formed. The second reason is that carbon deposited on the surface or inside the nickel silicide layer reacts with the hydrogen radicals to form methane ($CH_4$) gas and is discharged. For these reasons, carbon deposition in the silicide layer formed by the method of the present invention is reduced, enabling contact resistivity to be reduced and affording an advantage in that there are few adverse effects on adhesion at subsequent processes.

Second Embodiment

The method of manufacturing a semiconductor device according to a second embodiment will be described taking an example where device shape of the chip back surface side differs. FIGS. 4, 5, and 6 are cross-sectional views of a semiconductor device during manufacture according to the second embodiment. The method of manufacturing a semiconductor device according to the second embodiment differs from the method of manufacturing a semiconductor device according to the first embodiment in that a trench 15 is formed at a depth so as to not penetrate through the silicon carbide wafer from a wafer back surface. The back surface electrode 3a is formed by the back surface of the silicon carbide wafer and, the side wall and the bottom of the trench 15 (FIG. 4).

A reverse blocking insulated gate bipolar transistor (RB-IGBT) is an example of a semiconductor device having such a device structure. In this case, although not depicted, a MOS gate structure is formed as the device structure 2 of the front surface side; and in the side surface and the back surface of a region of the silicon carbide wafer becoming the semiconductor chip 1, a semiconductor region of a conductivity type that differs from that of the semiconductor chip 1 is formed to become a drift region.

Even in a semiconductor device of such a device structure, as depicted in FIG. 5, similar to the first embodiment, by exposing the silicon carbide wafer (the entire device) to the hydrogen plasma atmosphere, the back surface electrode 3a adsorbs the hydrogen radicals 4 and is heated by the heat generated from the bond energy released when hydrogen molecules formed. As a result, as depicted in FIG. 6, from the side surface (the side wall and bottom of the trench 15) of the silicon carbide wafer region that becomes the semiconductor chip 1, to the back surface (wafer back surface) of the region, the silicide layer 3b is formed to become an ohmic contact with the silicon carbide wafer.

As described, according to the second embodiment, effects identical to those of the first embodiment can be obtained.

Third Embodiment

Figure 9:
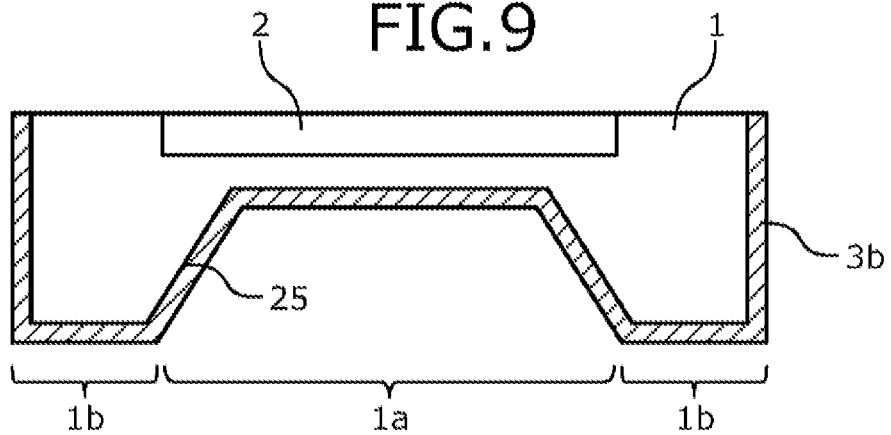
FIG. 9 is a cross-sectional view of the semiconductor device during manufacture according to the third embodiment.

The method of manufacturing a semiconductor device according to a third embodiment will be described taking an example where device shape of the chip back surface side differs. FIGS. 7, 8, and 9 are cross-sectional views of a semiconductor device during manufacture according to the third embodiment. The method of manufacturing a semiconductor device according to the third embodiment differs from the method of manufacturing a semiconductor device according to the first embodiment in that, as depicted in FIG. 7, the device shape of the chip back surface side is such that, for example, a thickness of a predetermined region 1a alone is made thin by a trench of a predetermined depth and a thickness of other portions 1b is left to be thick. Thus, for example, when the thickness of the semiconductor wafer is made thin, improved strength of the semiconductor wafer can be facilitated, forming a structure that prevents cracking caused by handling during wafer delivery, internal stress, etc.

Even in a semiconductor device of such a device structure, as depicted in FIG. 8, similar to the first embodiment, by exposing the silicon carbide wafer (the entire device) to the hydrogen plasma atmosphere, the back surface electrode 3a adsorbs the hydrogen radicals 4 and is heated by the heat generated from the bond energy released when hydrogen molecules formed. The back surface electrode 3a, for example, is formed by the back surface and the side surface of the region that becomes the semiconductor chip 1, and the side wall and the bottom of the trench 25. As a result, as depicted in FIG. 9, from the side surface (the side wall and the bottom of the trench 25) of the region that becomes the semiconductor chip 1, to the back surface and the side surface of the region, the silicide layer 3b is formed to become an ohmic contact with the silicon carbide wafer.

As described, according to the third embodiment, effects identical to those of the first embodiment can be obtained.

Fourth Embodiment

Figure 10:
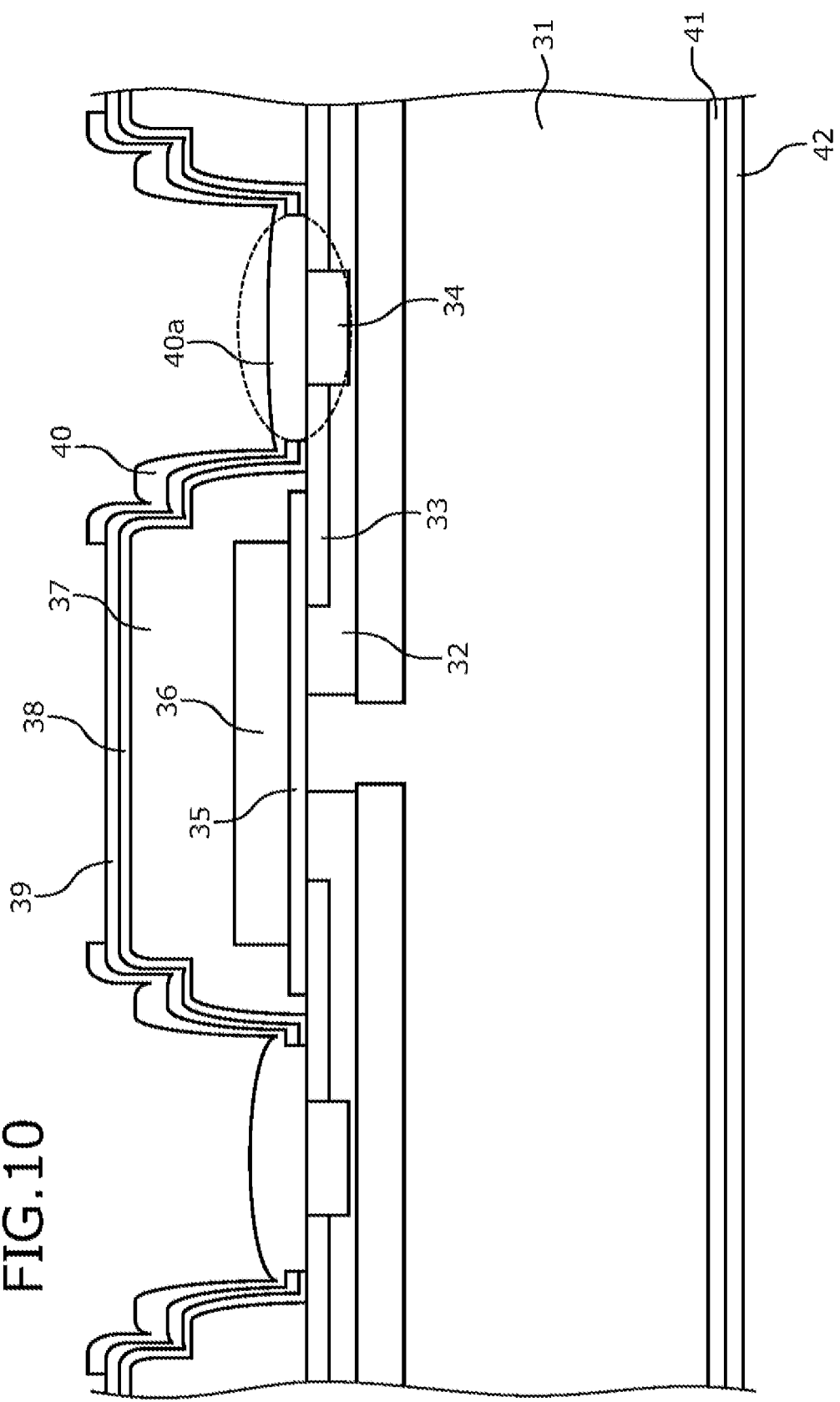
FIG. 10 is a cross-sectional view of a semiconductor device during manufacture according to the method of manufacturing a semiconductor device according to a fourth embodiment.

The method of manufacturing a semiconductor device according to a fourth embodiment will be described taking an example where a MOSFET is produced (manufactured). FIG. 10 is a cross-sectional view of a semiconductor device during manufacture according to the method of manufacturing a semiconductor device according to the fourth embodiment. The method of manufacturing a semiconductor device according to the fourth embodiment differs from the method of manufacturing a semiconductor device according to the first embodiment in that in a surface where a MOS gate is produced, the MOS gate structure is covered by a titanium layer 39 and in this state, the entire silicon carbide wafer is exposed to the hydrogen plasma atmosphere, whereby hydrogen radicals in the hydrogen plasma atmosphere are prevented from entering a gate insulating film 35 configuring the MOS gate structure.

More specifically, as depicted in FIG. 10, in the front surface side of the silicon carbide wafer becoming a drift region 31, the MOS gate structure formed of a base region 32, a source region 33, a contact region 34, the gate insulating film 35, and a gate electrode 36 is formed by a general method. Next, in the front surface of the silicon carbide wafer, an interlayer insulating film 37 is formed so as to cover the MOS gate structure. Next, for example, by photolithography and etching, the interlayer insulating film 37 is patterned and a contact hole is formed exposing the source region 33 and the contact region 34. Next, by a sputtering method, a vapor deposition method, etc., a titanium nitride (TiN) layer (barrier layer) 38 and the titanium layer 39 are sequentially formed on the interlayer insulating film 37. The titanium layer 39 is formed from substantially 100% pure titanium. As a result, the titanium layer 39 is formed to cover the interlayer insulating film 37 on the MOS gate structure.

Next, for example, by photolithography and etching, the titanium nitride layer 38 and the titanium layer 39 are patterned exposing the source region 33 and the contact region 34 at a contact hole. Next, by a sputtering method, a vapor deposition method, etc., a nickel layer 40 that contacts the source region 33 and the contact region 34 is formed so as to be embedded inside the contact holes. Next, for example, by photolithography and etching, the nickel layer 40 is patterned and inside the contact hole, the nickel layer 40 is left. The nickel layer 40, for example, extends to the surface of the titanium layer 39 on the interlayer insulating film 37. Although described hereinafter, at this stage, in the surface of the titanium layer 39, a native oxide film is formed and by this native oxide film, heat generation from the titanium layer 39 can be delayed in the plasma processing.

Next, the entire silicon carbide wafer (the entire device) having the MOS gate structure, the titanium layer 39, and the nickel layer 40 formed thereon, is exposed to the hydrogen plasma atmosphere. By the exposure to the hydrogen plasma atmosphere, the nickel layer 40 adsorbs hydrogen radicals in the hydrogen plasma atmosphere and is heated by the heat generated from the bond energy released when hydrogen molecules formed. The heat generated by the nickel layer 40 is transferred, whereby the source region 33 and the contact region 34 directly below the nickel layer 40 are heated. As a result, the nickel layer 40 is converted to silicide, forming a nickel silicide layer 40a that becomes an ohmic contact with the silicon carbide semiconductor portion (portion encompassed by dotted ellipse). FIG. 10 depicts a case where the entire nickel layer 40 becomes the nickel silicide layer 40a.

Here, although the titanium layer 39 that covers the interlayer insulating film 37 on the MOS gate structure is also a transition metal, the oxide film, which strongly bonds with titanium is formed in the surface of the titanium layer 39 and thus, the titanium layer 39 is not exposed. As a result, during exposure to the hydrogen plasma atmosphere, hydrogen radicals are consumed for the reduction of the oxide film on the surface of the titanium layer 39 and therefore, while the oxide film is present, despite being a transition metal, the titanium is not heated. For example, in a case where the MOS gate structure is not covered by the titanium layer 39, although the MOS gate structure is not heated by the titanium layer 39 (transition metal), hydrogen radicals pass through the interlayer insulating film 37 and reach the gate insulating film 35. When hydrogen radicals reach the gate insulating film 35, the interface properties of the gate insulating film 35 and the silicon carbide semiconductor portion may degrade. However, by covering the MOS gate structure by the titanium layer 39, hydrogen radicals can be prevented from entering the MOS gate structure.

Further, while the oxide film is present in the surface of the titanium layer 39, the titanium layer 39 is not exposed at the uppermost surface and therefore, does not react with the hydrogen radicals or generate heat. As a result, the MOS gate structure covered by the titanium layer 39 is not heated while the titanium layer is covered by the surface oxide film. The titanium layer 39 generates heat after the oxide film has been consumed consequent to the progress of the reduction reaction between the strong oxide film on the surface of the titanium layer 39 and the hydrogen radicals, whereby the hydrogen radicals produce water vapor ($H_2O$) and are discharged. On the other hand, the oxide film on the surface of the nickel layer 40 is easily reduced, whereby the nickel layer 40 is exposed sooner than the reduction reaction of the oxide film on the surface of the titanium layer 39 is completed exposing the titanium layer 39. Therefore, while the reduction reaction of the oxide film in the surface of the titanium layer 39 is progressing, the nickel layer 40 alone is exposed to the hydrogen plasma to thereby, generates heat and is heated.

Therefore, the plasma processing period is set such that the plasma processing for converting the nickel layer 40 to a silicide is completed before or at the time when the reduction reaction of the oxide film on the surface of the titanium layer 39 is completed, whereby the nickel layer 40 alone can be heated. As a result, the nickel layer 40 can be converted to a silicide and the MOS gate structure covered by the titanium layer 39 can be prevented from be heated. The plasma processing period, for example, can be set based on the thickness of the oxide film on the surface of the titanium layer 39. The oxide film on the surface of the titanium layer 39 may be a native oxide film, or may be an oxide film formed by forced oxidation of the surface of the titanium layer 39. Other than titanium (Ti), zirconium (Zr), hafnium (Hf), and the like may be used as a metal forming the strong oxide film in this manner. In addition, a nitride such as titanium nitride or silicon nitride may be used. In particular, when titanium (Ti) is used in the transition metal layer, silicon nitride, zirconium (Zr), hafnium (Hf), and the like are effective.

Thus, the source region 33 and the contact region 34 directly beneath the nickel layer 40 alone are heated using the heat generated from the nickel layer 40 forming the transition metal layer. Here, by using the difference of the time consumed for the oxide film on the surface of the nickel layer 40 to be reduced and the time consumed for the oxide film on the surface of the titanium layer 39 covering the interlayer insulating film 37 on the MOS gate structure to be reduced, the nickel layer 40 alone is heated, whereby the MOS gate structure can be prevented from being heated excessively.

The titanium nitride layer 38 conducts the heat generated by the nickel layer 40 toward the film surface and thereby, functions as a heat barrier preventing the heat from passing through the interlayer insulating film 37 and reaching the MOS gate structure (in particular, the gate insulating film 35). Therefore, heating of the MOS gate structure can be further prevented. The titanium nitride layer 38 need not be formed when the difference of the time consumed for the oxide film on the surface of the nickel layer 40 to be reduced and the time consumed for the oxide film on the surface of the titanium layer 39 to be reduced is sufficient. In place of the titanium nitride layer 38, a metal formed from silicon and aluminum, or an alloy comprising this metal as a primary component functions as a heat barrier layer.

Next, by embedding in the contact hole, an electrode pad (not depicted) formed from aluminum (Al), for example, so as to contact the nickel silicide layer 40a, a front surface electrode is completed. Thereafter, remaining device structures (not depicted) of the wafer front surface side, such as a passivation film, and a back surface electrode formed by a nickel layer 41 and a titanium layer 42 sequentially stacked in the wafer back surface, etc. are formed, and cutting into chips (dicing) is performed, whereby the MOSFET is completed. The titanium nitride layer 38 and the titanium layer 39 do not adversely affect device properties and therefore, can be left on semiconductor device in the completed product. Even in a case where a back surface electrode is to be formed, the back surface electrode may be formed by the same method in the case of forming an ohmic contact in the wafer front surface as described above. Further, an ohmic contact (the nickel silicide layer 40a) of the wafer front surface side and an ohmic contact (back surface electrode) of the wafer back surface side may be formed simultaneously.

Figure 11:
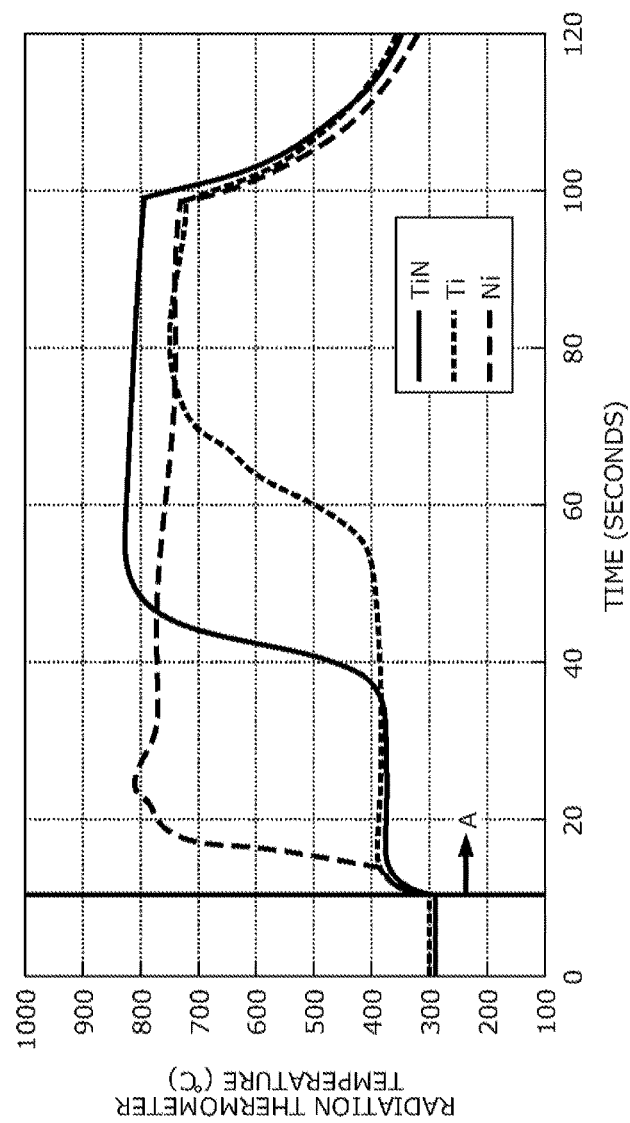
FIG. 11 is a graph depicting for each transition metal layer, a temperature profile consequent to plasma processing.
Figure 12:
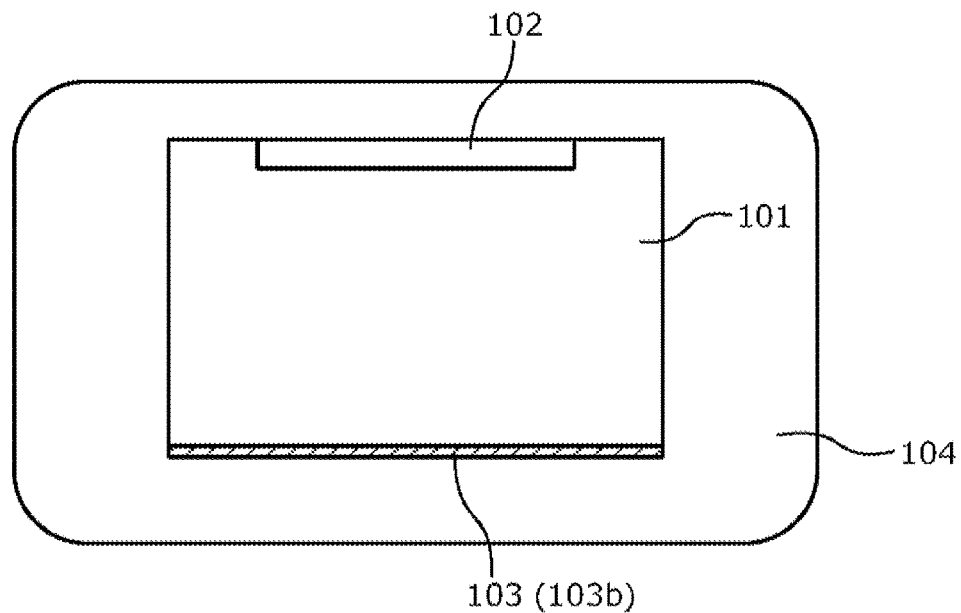
FIG. 12 is a cross-sectional view schematically depicting the state of a conventional vertical device during furnace annealing.
Figure 13:
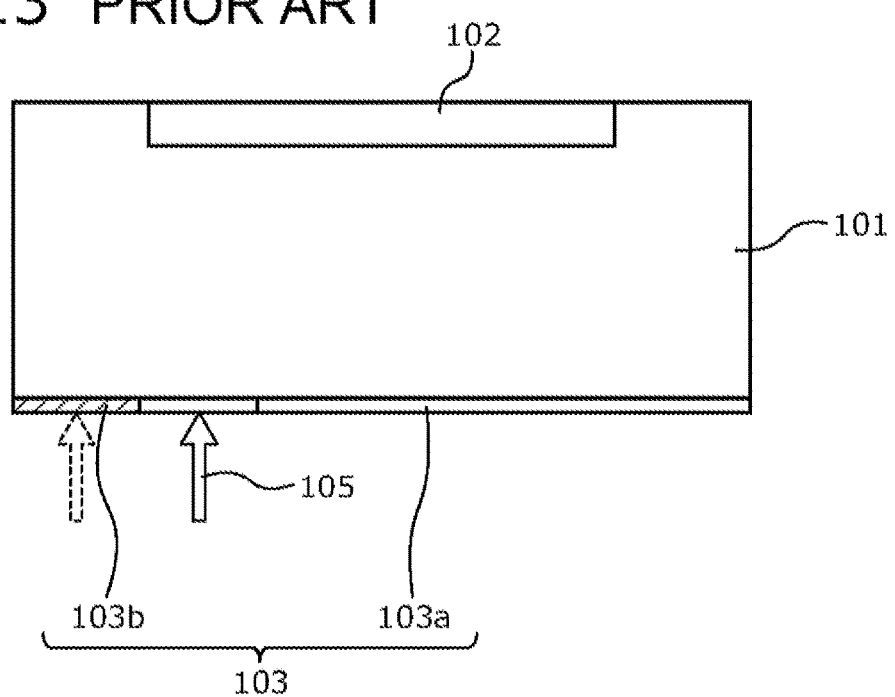
FIG. 13 is a cross-sectional view schematically depicting the state of a conventional vertical device during laser annealing.
Figure 14:
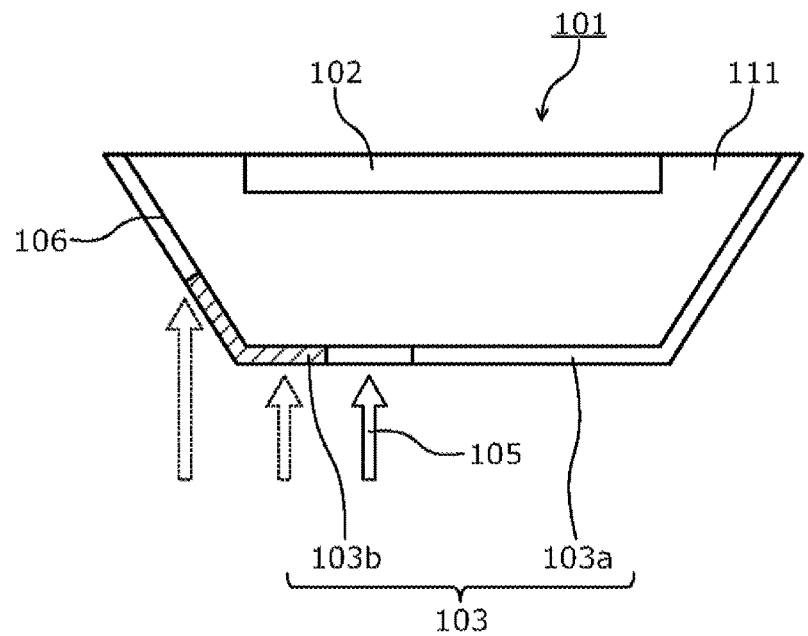
FIG. 14 is a cross-sectional view schematically depicting the state of the conventional vertical device during laser annealing.
Figure 15:
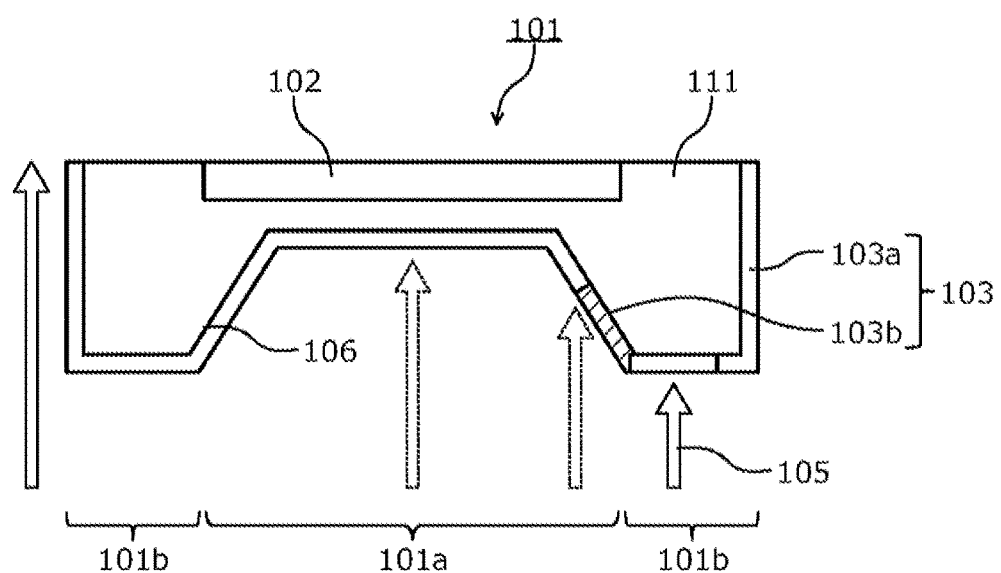
FIG. 15 is a cross-sectional view schematically depicting the state of the conventional vertical device during laser annealing.

Temperature profiles consequent to plasma processing will be described for each transition metal layer. FIG. 11 is a graph depicting for each transition metal layer, a temperature profile consequent to plasma processing. FIG. 11 depicts verification results for temperature profiles of the nickel layer 40, the titanium nitride layer 38, and the titanium layer 39 (Ni, TiN, and Ti, respectively, in FIG. 11) during exposure to hydrogen plasma in the production of a MOSFET according to the method of manufacturing a semiconductor device according to the fourth embodiment. FIG. 11 depicts temperature profiles in a case where plasma processing was performed with the native oxide film being formed in the surface of the titanium layer 39 and the nickel layer 40 by exposure to the air during transport. In the plasma processing, inside a chamber, substantially 100% pure hydrogen gas was introduced at a flowrate of 10 sccm and after the pressure was reduced to about 25 Pa, microwave energy of 1000 W was supplied, generating microwave plasma. The temperatures indicated along the vertical axis in FIG. 11 are measured values obtained using a radiation thermometer and therefore, although relative temperatures of the metals are accurate, the actual temperature increase of the metals slightly differs from the measured values.

From the results depicted in FIG. 11, it was confirmed that after the start of plasma processing (start point of arrow A), the nickel was the first to generate heat and within about 10 seconds, for example, was heated to a high temperature of about 800 degrees C. In other words, the oxide film on the surface of the nickel layer 40 for forming the ohmic contact with the silicon carbide semiconductor portion was found to have the shortest reducing time. Meanwhile, the titanium nitride started heating about 20 seconds after the nickel started heating and the titanium started heating about 40 seconds after the nickel started heating. In other words, it was confirmed that the oxide film on the surface of the titanium layer 39 preventing the MOS gate structure from being excessively heated had the longest reducing time.

As described, according to the fourth embodiment, effects identical to those of the first embodiment can be obtained. Further, according to the fourth embodiment, by covering the MOS gate structure by the titanium layer and completing the plasma processing before or at the time that the reduction reaction of the oxide film on the surface of the titanium layer is completed, the hydrogen radicals in the hydrogen plasma atmosphere can be prevented from reaching the MOS gate structure and the MOS gate structure can be prevented from being heated. As a result, the device properties can be further prevented from degrading.

The present invention is not limited to the above embodiments and various changes can be made thereto within a scope that does not depart from the spirit of the present invention. Further, in the embodiments above, although description is given using a silicon carbide substrate as an example, identical effects are achieved for a semiconductor substrate (silicon substrate) that uses silicon. In the case of a silicon substrate, the temperature of the heat generated from the bond energy when hydrogen radicals are adsorbed and hydrogen molecules are formed is set based on the state of silicon substrate, the melting point of the transition metal layer, etc. Further, in the embodiments, although description is given using a semiconductor device having a MOS gate structure, the method is not limited hereto and for example, is applicable to a semiconductor device having a device structure such as an insulating film or semiconductor portion for which device properties are at risk of changing consequent to heating.

According to the invention, the transition metal layer alone generates heat and is heated, whereby a transfer of the heat generated by the transition metal layer, heats a portion of the silicon carbide substrate contacting the transition metal layer. As a result, a metal silicide layer that becomes an ohmic contact with the silicon carbide substrate can be formed. Further, since constituent portions other than the transition metal layer do not generate heat, for example, heat is not applied near the gate insulating film of the MOS gate structure. Further, irrespective of surface unevenness, heating can be performed selectively and collectively. Further, for example, since device structures such as the MOS gate structure are covered by the titanium layer and the plasma processing is completed before or when the reduction reaction of the oxide film on the surface of the titanium layer is completed, hydrogen radicals in the hydrogen plasma atmosphere can be prevented from reaching the device structure and the MOS gate structure can be prevented from being heated. Therefore, degradation of interface properties of the gate insulating film and the silicon carbide semiconductor portion can be prevented.

The method of manufacturing a semiconductor device according to the present invention achieves an effect in that an ohmic contact of low contact resistivity can be formed and device properties can be prevented from degrading.

As described, the method of manufacturing a semiconductor device according to the present invention is particularly suitable for power semiconductor devices used in a semiconductor device that uses a silicon carbide semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
    forming a device structure in a surface of the semiconductor substrate;
    forming, in a face of the semiconductor substrate, a transition metal layer that contacts the semiconductor substrate; and
    exposing the semiconductor substrate having the transition metal layer formed thereon to a hydrogen plasma atmosphere for a predetermined period,
    wherein the hydrogen plasma atmosphere is formed to have a predetermined plasma density by microwaves having a predetermined electric energy so as to heat only the transition metal layer to a predetermined temperature, and
    wherein during exposing the semiconductor substrate to the hydrogen plasma atmosphere, a portion of the semiconductor substrate contacting the transition metal layer is heated by a transfer of the heat from the transition metal layer, and an ohmic contact is formed at an interface of the transition metal layer and the semiconductor substrate by reaction of the transition metal layer and the semiconductor substrate.

2. The method according to claim 1, wherein the surface where the device structure is formed and the face where the transition metal layer is formed are the same,
    wherein the method further comprises, after forming the device structure and before forming the transition metal layer, forming a metal layer which so as to cover the device structure,
    wherein the surface of the transition metal layer includes an oxide film and, during forming the metal layer, a strongly bonded oxide film is formed in a surface of the metal layer that consumes more time to be reduced during exposure of the semiconductor substrate to the hydrogen plasma atmosphere than the oxide film on the surface of the transition metal layer,
    wherein during forming the transition metal layer, the transition metal layer that contacts the semiconductor substrate is formed at a portion of the semiconductor substrate excluding a portion where the device structure is disposed, and
    wherein during exposing the semiconductor substrate to the hydrogen plasma atmosphere, the semiconductor substrate having the metal layer and the transition metal layer formed thereon is exposed to the hydrogen plasma atmosphere to reduce the strongly bonded oxide film of the surface of the metal layer and cause the transition metal layer to generate heat, and, before or when reduction of the strongly bonded oxide film of the surface of the metal layer is completed, exposing the semiconductor substrate to the hydrogen plasma atmosphere is completed.

3. The method according to claim 2, wherein, after forming the device structure and before forming the metal layer, a barrier layer comprising a metal that prevents transfer of heat from the transition metal layer is formed so as to cover the device structure, and
    wherein during forming the metal layer, the metal layer is formed on the barrier layer.

4. The method according to claim 2, wherein the metal layer comprises titanium.

5. The method according to claim 1, wherein the transition metal layer is a metal layer comprising nickel, titanium, or tungsten, or an alloy layer comprising at least one of nickel, titanium, tungsten, molybdenum, tantalum, and silver as a primary component.

6. The method according to claim 1, wherein the device structure is an insulating gate structure comprising a metal-oxide film semiconductor.

7. The method according to claim 1, wherein, during forming the transition metal layer, the face of the semiconductor substrate where the transition metal layer is formed is on an opposite side of the semiconductor substrate with respect to the face where the device structure is formed, and
    wherein the method further comprises, after forming the device structure and before forming the transition metal layer, forming a predetermined pattern in the face that is on the opposite side of the semiconductor substrate with respect to the face where the device structure is formed.

8. The method according to claim 7, wherein the predetermined pattern includes a step that is uneven and that includes a side wall, and wherein the side wall of the step and the face that is on the opposite side of the semiconductor substrate with respect to the face where the device structure is formed form an angle that is equal to or more than 45 degrees and equal to or less than 75 degrees.

9. The method according to claim 1, wherein during exposing the semiconductor substrate with the transition metal layer formed thereon to the hydrogen plasma, hydrogen gas is injected into a chamber holding the semiconductor substrate so as to maintain a range from 10 Pa to 100 Pa while microwave energy equal to or greater than 1000 W is supplied.

* * * * *

UNITED STATES PATENT AND TRADEMARK OFFICE
CERTIFICATE OF CORRECTION

Page 1 of 1

PATENT NO. : 9,564,334 B2
APPLICATION NO. : 15/065853
DATED : February 7, 2017
INVENTOR(S) : Kenichi Iguchi et al.

It is certified that error appears in the above-identified patent and that said Letters Patent is hereby corrected as shown below:

In the Claims

In Claim 1, Line 3, before "a face" change "in" to --on--.
In Claim 2, Line 6, before "so as" delete "which"; and Line 10, before "a surface" change "in" to --on--.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*